United States Patent
Grisi et al.

(10) Patent No.: US 12,306,122 B2
(45) Date of Patent: May 20, 2025

(54) MINIATURIZED MR DEVICE COMPRISING A CELL CULTURE MICRO-CHAMBER AND METHOD FOR MANUFACTURING SUCH A DEVICE

(71) Applicant: ECOLE POLYTECHNIQUE FEDERALE DE LAUSANNE (EPFL), Lausanne (CH)

(72) Inventors: Marco Grisi, Préverenges (CH); Giovanni Boero, Préverenges (CH); Juergen Brugger, Vufflens-la-Ville (CH); Gaurasundar Marc Conley, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 1081 days.

(21) Appl. No.: 17/278,792

(22) PCT Filed: Sep. 20, 2019

(86) PCT No.: PCT/IB2019/057980
§ 371 (c)(1),
(2) Date: Mar. 23, 2021

(87) PCT Pub. No.: WO2020/065478
PCT Pub. Date: Apr. 2, 2020

(65) Prior Publication Data
US 2022/0026379 A1 Jan. 27, 2022

(30) Foreign Application Priority Data
Sep. 24, 2018 (WO) .................. PCT/IB2018/057348

(51) Int. Cl.
*G01N 24/08* (2006.01)
*G01N 24/10* (2006.01)
*G01R 33/30* (2006.01)

(52) U.S. Cl.
CPC ............. *G01N 24/08* (2013.01); *G01N 24/10* (2013.01); *G01R 33/302* (2013.01)

(58) Field of Classification Search
CPC ...... G01N 24/08; G01N 24/10; G01R 33/302; G01R 33/323
See application file for complete search history.

(56) References Cited

U.S. PATENT DOCUMENTS

2010/0001724 A1* 1/2010 Bashirullah .......... G01R 33/307
 324/318
2017/0102344 A1 4/2017 Lei et al.

FOREIGN PATENT DOCUMENTS

JP 2004-69309 A 3/2004
JP 2008-58142 A 3/2008
(Continued)

OTHER PUBLICATIONS

Tian Fook Kong et al., "Adhesive-based liquid metal radio-frequency microcoil for magnetic resonance relaxometry measurement", Lab Chip, vol. 12, No. 2, Nov. 2011, 10 pages.
(Continued)

*Primary Examiner* — John McGuirk
(74) *Attorney, Agent, or Firm* — Sughrue Mion, PLLC (57) ABSTRACT

MR device (100) comprising a miniaturized magnetic resonance system (101) and a cell culture chamber (502) for the analysis of biological samples of less than about 1000 μm in size, wherein said device (100) is at least partially covered by a passivation-binding layer (800). The invention also concerns a method for manufacturing said device (100), comprising a step of depositing a thin passivation-binding layer (800) on said system (101) The depositing step is
(Continued)

preferably performed through a deposition process selected from chemical vapor deposition and physical vapor deposition.

16 Claims, 6 Drawing Sheets

(56) References Cited

FOREIGN PATENT DOCUMENTS

| | | |
|---|---|---|
| JP | 2009-506345 A | 2/2009 |
| WO | 2007/027843 A2 | 3/2007 |
| WO | 2008/091364 A2 | 7/2008 |

OTHER PUBLICATIONS

Marco Grisi et al., "NMR spectroscopy of single sub-nL ova with inductive ultra-compact single-chip probes", Scientific Reports, vol. 7, No. 1, Mar. 2017, 8 pages.
Written opinion for PCT/IB2019/057980 dated Jan. 24, 2020.
International search report for PCT/IB2019/057980 dated Jan. 24, 2020.

* cited by examiner

MINIATURIZED MR DEVICE COMPRISING A CELL CULTURE MICRO-CHAMBER AND METHOD FOR MANUFACTURING SUCH A DEVICE

CROSS-REFERENCE TO RELATED APPLICATIONS

This application is a National Stage of International Application No. PCT/IB2019/057980 filed Sep. 20, 2019, which claims priority under U.S.C. § 119(a) to Patent Application No. PCT/IB2018/057348 filed on Sep. 24, 2018.

TECHNICAL FIELD

The present invention belongs to the field of nuclear magnetic resonance spectroscopy for the analysis of microscopic objects.

BACKGROUND ART

Nuclear Magnetic Resonance (NMR) and Electron Spin Resonance (ESR) (often generically indicated as magnetic resonance, MR) are widely known spectroscopic tools used for chemical analysis of intact bulk matter. The use of these spectroscopic tools requires a static external magnetic field $B_0$. In such environment, the electrons and nuclei of the sample are capable to respond, in a collective way, to excitation via magnetic fields oscillating at the so called Larmor frequency $v_0=(\gamma/2\pi)B_0$, where $\gamma$ is the gyromagnetic ratio of the target nucleus or electron. The effective value of the gyromagnetic ratio $\gamma_{eff}$ depends on the nuclear species (including isotopes) and on the chemical environment in which the nucleus and/or electron is embedded. For a given chemical environment, in fact, the screening of the external magnetic field is different, resulting in a slightly different Larmor frequency. This phenomenon of separation of the Larmor frequencies as consequence of the chemical configuration in which the target nuclei and/or electrons are embedded is known as chemical shift. NMR and ESR experiments, which can be performed both in a pulsed or continuous excitation scheme, allow for quantitative inspection of the different chemical shifts present within the samples, therefore resulting in the ability of obtaining chemical information with a potentially very high resolving power.

One relevant property of NMR (and, to some extent, ESR) techniques is bio-compatibility. Such unique property is due to the use of relatively low frequencies as necessary to create the resonance phenomenon. Thanks to the relatively low frequencies in play the excitation of the NMR can be performed on e.g. an intact living body with a weak capability of interfering with biological molecules and processes, therefore avoiding any biological alteration of the sample. Nowadays NMR is routinely used to inspect, for aims of research and medical diagnostic, living animals and humans. The gyromagnetic ratio of protons has a value of about 42.5775 MHz/T. The use of NMR for in-vivo medical diagnostic is currently approved, for humans, up to field values of 7 T (corresponding to a 1H Larmor frequency of about 300 MHz).

The current MR instrumentation available on the market is optimized for the inspection of solid, biological, or liquid samples down to volumes as small as 1 μL. Such instruments employ, as exciting and sensing elements, inductors obtained with metallic conductors. Such inductors come in many shapes and forms, each suited for a specific sample and/or application (e.g., solenoidal, helmholtz, and saddle coils).

In order to apply MR techniques to the analysis of microscopic samples the microfabrication of inductors was previously proposed and implemented. Examples of such prior art can be found in references [1-3] and described in US 2011/0091987. With this approach miniaturized coils (i.e., micro-coils) are connected to passive components (typically capacitors) in order to realize structures that resonate at the Larmor frequency. Such resonators are then interfaced via cables to standard transmit-receive (TX/RX) electronics. With this approach the leads connecting the micro-coil to the external components and electronics form a parasitic inductor that complicates considerably the application to MR of small samples. Such parasitic structures, besides introducing losses that decrease the effective signal-to-noise ratio, detect signals from regions other than that occupied by the sample, introducing unwanted signals when the experimenter introduces components or structures aimed at confining the sample. Given these limitations micro-coils did not yet provide versatile solutions to the MR community at scales below 1 μL.

Another approach proposed recently is what is hereby called an "ultra-compact" MR device, where the necessary TX (transmit) and/or RX (receive) electronics is placed very close to the exciting and/or sensing element (e.g., a micro-coil). An example of ultra-compact MR device is a complementary-metal-oxide-semiconductor (CMOS) micro-chip where TX/RX electronics and micro-coil are co-integrated on the same substrate. Examples of such devices are described in [4-7]. Ultra-compact MR devices offer the advantage of nearly absent parasitic sensitive volumes and enable an eased implementation of state-of-art MR at volume scales ranging from 5 pL up to 1 μL.

A challenge that is currently unfulfilled is to create versatile sample-handling strategies that allow users to easily manipulate and hold samples, particularly solid samples having a dimension typically comprised between 5 and 1000 μm such as embryos (e.g., mammalian, aquatic species, vegetal), eukaryotic cells or bacteria, 3D cell cultures, stem cell organoids, micro-tissues of any kind in close proximity to a sensing element (i.e. as close as 1 nm), in very small liquid medium volumes (i.e. less than about 1 μL), and at the same time provide a controlled and bio-compatible environment for the biological entity being analysed. Assuming the use of an ultra-compact MR device, there is need of a comprehensive structure aimed at providing bio-compatible and controllable conditions, a versatile sample-handling strategy, robustness against intensive use and exposure to liquids of choice (e.g., culture media for cells growth and/or development).

SUMMARY OF THE INVENTION

The present invention addresses and overcomes the above-mentioned drawbacks by providing magnetic resonance probes of the ultra-compact type (i.e., having localized sensitive volumes nearby the active elements of the sensor) contained in enclosures and combined with microstructures to implement magnetic resonance biological culture chambers that can be adapted for living microorganisms and cells. The uses of the invention may relate to biochemistry research and/or clinical diagnostics involving biological samples such as embryos (e.g., mammalian, aquatic species, vegetal), eukaryotic cells or bacteria, 3D cell cultures, stem cell organoids, micro-tissues of any kind. The uses of the invention may also relate to magnetic sensors.

One of the key challenges faced and solved by the inventors was that of creating a system comprising a miniaturized magnetic resonance device, operatively coupled with a bio-culture micro-chamber, which was optimized for the analysis of biological samples of less than about 1000 μm in size, i.e. a system providing an excellent spin-sensitivity (e.g. a spin sensitivity of $2 \cdot 10^{13}$ spins/Hz$^{1/2}$ in a volume of 1 nL) for the samples under study and (a) sensing region(s) smaller than 1 μL. To this aim, a manufacturing method has been put in place exploiting a deposition process to provide a conformal layer which 1) protects the ultra-compact sensing device (passivation), 2) fixes the micro-structure to the substrate (binding) and 3) possibly provides bio-compatible ground and variants (e.g., functionalized surface for cells fixation and/or capture).

Accordingly, in a first aspect it is provided herein a MR device comprising a miniaturized magnetic resonance system and a cell culture chamber for the analysis of biological samples of less than about 1000 μm in size, said device comprising passivation-binding layer that at least partially covers said system. The invention also concerns a method for manufacturing said device, the method comprising a step of depositing a thin passivation-binding layer on said system. In a preferred embodiment, said depositing is performed through a deposition process selected from chemical vapor deposition and/or physical vapor deposition.

The cell culture chamber preferably has a volume comprised between 0.1 nL and 1 μL and is bound to said system.

Advantageously the cell culture micro-chamber comprises a floor made of said layer.

The above and other objects, features and advantages of the present invention will become more apparent from a study of the following description with reference to the attached figures showing some preferred aspects of said subject-matter. However, the present invention is not limited to the embodiments as described in the following and/or depicted in the drawings; to the contrary, the scope of the present invention is defined by the appended claims.

BRIEF DESCRIPTION OF DRAWINGS

FIG. 3a and FIG. 3b show schematic cross-sections (lateral view) of embodiments of magnetic resonance bio-culture micro-chambers, mounted on a printed circuit board. In FIG. 3a the μMRBM does not have a top-cover for the enclosure and hosting-microstructure, whereas in FIG. 3b there are such covers.

FIG. 4 shows 3D renderings of basic examples of "external auxiliary coils" complementing an ultra-compact sensor. In FIG. 4a a gradient coil is depicted, in FIG. 4b a planar coil is placed in close proximity of the sensing element. Such coils can be used to both implement pulsed gradients or excitation pulses;

FIGS. 5a-5b illustrates two basic examples of internal auxiliary coil.

FIGS. 6a-6b shows two examples of arrayed ultra-compact sensor/s and hosting micro-structure/s that can be used as a base for making arrayed μMRBM/s.

DETAILED DESCRIPTION OF THE INVENTION

The subject-matter herein described will be clarified in the following by means of the following description of those aspects which are depicted in the drawings. It is however to be understood that the subject matter described in this specification is not limited to the aspects described in the following and depicted in the drawings; to the contrary, the scope of the subject-matter herein described is defined by the claims. Moreover, it is to be understood that the specific conditions or parameters described and/or shown in the following are not limiting of the subject-matter herein described, and that the terminology used herein is for the purpose of describing particular aspects by way of example only and is not intended to be limiting.

Unless defined otherwise, technical and scientific terms used herein have the same meaning as commonly understood by one of ordinary skill in the art to which this invention belongs. Further, unless otherwise required by the context, singular terms shall include pluralities and plural terms shall include the singular. The methods and techniques of the present disclosure are generally performed according to conventional methods well known in the art and as described in various general and more specific references that are cited and discussed throughout the present specification unless otherwise indicated. Further, for the sake of clarity, the use of the term "about" is herein intended to encompass a variation of +/−10% of a given value.

The following description will be better understood by means of the following definitions.

As used in the following and in the appended claims, the singular forms "a", "an" and "the" include plural referents unless the context clearly dictates otherwise. Also, the use of "or" means "and/or" unless stated otherwise. Similarly, "comprise", "comprises", "comprising", "include", "includes" and "including" are interchangeable and not intended to be limiting. It is to be further understood that where for the description of various embodiments use is made of the term "comprising", those skilled in the art will understand that in some specific instances, an embodiment can be alternatively described using language "consisting essentially of" or "consisting of."

For "thin film or layer" is herein meant a solid element having a thickness much smaller than the other dimensions, e.g. at least one fifth compared to the other dimensions. It is a solid layer having an upper surface and a bottom surface, with any suitable shape, and a thickness in the order of nanometers or even micrometers, depending on the needs and the circumstances, e.g. the manufacturing steps used to produce it. In preferred embodiments, the film according to the invention has a thickness comprised between about 1 nm and 1000 micrometers, preferably between about 1 nm and 600 micrometers, between about 1 nm and 300 micrometers, between about 1 nm and 100 micrometers, between about 1 nm and 50 micrometers, between about 100 nm and 100 micrometers, between about 1 micrometer and 500 micrometers, between about 1 micrometer and 300 micrometers, between about 1 micrometer and 100 micrometers, between about 10 micrometers and 100 micrometers or between about 1 micrometer and 50 micrometers.

The term "passivation" indicates the behaviour of the thin film or layer according to the present invention, said film or layer acting as an isolating shield material preventing physical, chemical and/or electrical connections between two or more elements of the device such as for instance electrical components and liquid media, thus avoiding for instance short circuits, as well as for instance corrosion due to oxidation of metal components.

For "deposition" is herein meant the act of applying a thin film to a surface, which foresees any technique for depositing a thin film of material onto a substrate or onto previously deposited layers. "Thin" is a relative term, but most deposition techniques control layer thickness within a few tens of nanometres. A deposition method can include one of chemical vapor deposition, physical vapor deposition, spin coating and spraying. In one embodiment according to the present invention, the deposition method comprises a chemical vapor deposition process. In an alternative or additional embodiment, the deposition method comprises a physical vapor deposition process.

A "chemical vapor deposition" process, or "CVD", is a deposition method used to produce high quality, high-performance solid materials, typically under vacuum. In typical CVD, a substrate or wafer is exposed to one or more volatile precursors, which react and/or decompose on the substrate surface to produce the desired deposit. CVD is commonly used to deposit conformal films and augment substrate surfaces in ways that more traditional surface modification techniques are not capable of. CVD is extremely useful in the so-called atomic layer deposition at depositing extremely thin layers of material. In the frame of the present invention, chemical vapor deposition is meant to include atmospheric pressure CVD (APCVD), low-pressure CVD (LPCVD) and ultrahigh vacuum CVD (UHVCVD). Moreover, in the frame of the present invention, chemical vapor deposition is meant to include plasma processing methods such as microwave plasma-assisted CVD (MPCVD), plasma-enhanced CVD (PECVD), remote plasma-enhanced CVD (RPECVD), atomic-layer CVD (ALCVD), combustion chemical vapor deposition (CCVD), hot filament CVD (HFCVD), hybrid physical-chemical vapor deposition (HPCVD), rapid thermal CVD (RTCVD), vapor-phase epitaxy (VPE), photo-initiated CVD (PICVD) and laser chemical vapor deposition (LCVD).

A "physical vapor deposition" process, or "PVD", generally describes a variety of vacuum deposition methods which can be used to produce thin films and coatings. PVD is characterized by a process in which the material goes from a condensed phase to a vapor phase and then back to a thin film condensed phase, so to deposit layers of material atom-by-atom or molecule-by-molecule on a solid substrate. In the frame of the present invention, physical vapor deposition is meant to include cathodic arc deposition, electron beam physical vapor deposition, evaporative deposition or evaporation, sputter deposition, sublimation sandwich method, ion beam-assisted deposition and hybrid physical-chemical vapor deposition (HPCVD).

For "active element" is herein meant a set of tools that are used to excite and/or detect the resonance, which can consist of electronics and/or optical elements (such as lasers, on-chip light sources, plasmonic structures or micro-lenses).

For "sensing element" is herein meant the element of the system of the present invention that is used as signal pick-up before the necessary operation of amplification (and, eventually, frequency down-conversion). In some cases, such as the case where this element is made by an inductor, the sensing element can be used for NMR excitation and detection, for excitation only purposes, or detection only purposes. For this reason, the sensing element is also referred to herein as "sensing and/or excitation element". The "sensing element" of an ultra-compact device defines the region in which the sensing is performed, its geometrical properties, the limits to the performance in terms of sensing power, the methodology used to perform the sensing.

To date there are two physical phenomena that can be exploited to realize such sensing elements, namely inductive and opto-magnetic phenomena. In the inductive sensing approaches, the sensor consists of inductor/s realised with metallic windings. In this realization the dynamics of the sample magnetization typical of magnetic resonance, is transformed, by Faraday's law, into voltage signals. In operation, the sample has to sit within the region of space over which the inductor is capable of generating magnetic fields when some current runs through it. A current flowing through a coil induces a magnetic flux which, if intercepted by a second adjacent coil, can induce a voltage. In such scenario the two coils are said to be coupled. The "coupling coefficient k" is a dimensionless number, between 0 and 1, which indicates the fraction of magnetic flux produced by one coil and intercepted by a second coil. This number depends strongly on the relative distance and orientation between the two coils. Called $L_1$ the self-inductance of one coil, $L_2$ the self-inductance of the other coil, N the mutual induction, the coupling coefficient is expressed as $k=N/(L_1 L_2)^{1/2}$.

Inductive sensing approaches can also exploit combinations of one or more coils and/or simple metallic structures that are inductively coupled in order to either simplify signal pick-up and treatment and/or enhance the sensing capabilities of the sensing element. Examples of such use of inductive coupling were reported for magic-angle spinning NMR probes, or for micro-probes for detection at high pressure in diamond anvil cells. An example of sensing elements that beneficially exploit coupling is a Lentz lens inductively coupled to a larger coil. In embodiments of the invention the sensing element of the ultra-compact sensor can also be made of a stacked combination of micro-coil/s and/or coupled metallic structures, such as Lentz lenses or similar. This stacked combination can be made within a single substrate (i.e., the micro-chip substrate), or by combining separated layers each containing at least one element of the stack.

By "sensing volume" or "sensing region" is herein meant the region of space related to the excitation and/or sensing of the magnetic resonance. Such region can be defined with respect to the spin-sensitivity. In general, it is possible to express the sensing capabilities of a magnetic resonance sensor as the amount of spins, and therefore target nuclei and/or electrons in the sample, that allow for a signal-to-noise ratio of 3 over a detection bandwidth of 1 Hz. Such value, also called spin-sensitivity ($\xi$), varies in space and results from the geometrical properties of the sensing element and the underlying detection mechanism. Given a sensing element and a Cartesian system of coordinates (x,y,z) there is, therefore, an associated spin sensitivity map $\xi(x,y,z)$. The sensing region dimension and geometry can be defined in relation to such field of scalar values. By using a mesh of the space where all elements have identical volumes dV ranging from 1 zL to 10 zL, to each member of the mesh it can be associated the corresponding contribution to the total signal $\xi(x_i,y_i,z_i)dV$. With $\xi_{max}$ the maximum of this collection of scalar values, the sensing region shall be defined as the union of dV volumes whose signal contribution is, individually, larger than $\xi_{max}/3$. Embodiments of the invention relate to devices that have individual sensing regions smaller than 1 µL.

A "microcoil" is a coil, or one or more connected loops, having at least one dimension in the micrometer (µm), or less than $10^{-3}$ meter (mm), scale. A microcoil usually comprises a thin material wound or gathered around a center or an imaginative center into spiral, helical or other shapes. A microcoil is defined by the material itself, the shape of the windings, and the separation between each windings. Solenoid type microcoils are multiple spiral wire loops, which may or may not be wrapped around a metallic core. A Solenoid type microcoil produces a magnetic field when an electrical current is passed through it and can create controlled magnetic fields. A Solenoid type microcoil can produce a uniform magnetic field in a predetermined volume of space. A "planar" microcoil is a microcoil with its windings substantially remained in an actual or imaginative plane. Such microcoils, whose inner diameters typically range in size between 0.1-0.5 mm (depending on the average size of the sample volume), are capable of obtaining high-quality NMR spectra with small sample volumes (nL-µL).

An array of microcoils is a collection of microcoils fabricated on a substrate, such as silicon, glass, or polymeric substrate. Each of the microcoils may be associated or corresponded with a sample space across which the microcoil is capable of generating an oscillating magnetic field as part of an NMR or ESR analysis. The sample space may be a space for holding a sample.

By "hosting micro-structure" it is herein meant a structure that, in embodiments of the invention, is placed on top and/or in the surrounding space of an ultra-compact magnetic resonance sensor. The hosting micro-structure is conceived to host a sample, solid and/or liquid, holding it within a sensing volume. By "enclosure" it is herein meant a container holding a liquid of choice which is in contact with the sample and a hosting micro-structure. As it will be evident, the enclosure and the hosting micro-structure are objects having dimensions on two different length scales, the former may be called "macroscopic" and the latter "microscopic".

Embodiments of the invention include hosting microstructures that are designed for samples "hosting only". Such realizations can consist of micro-wells of any shape where the samples are simply contained within the sensing region. In these embodiments the user places the sample at the culture micro-chamber (manually or via automated systems) and is capable to retrieve it once the experiment/s is/are concluded.

A "microchannel" is a channel, groove, or conduit having at least one dimension in the micrometer (µm), or less than $10^{-3}$ meter (mm), scale. Although microchannels are typically straight along their length, they may contain angles and curves of different degrees along their length. Although the microchannels typically have rectangular cross-sections, they may also have other shapes of cross-sections, such as circle. The microchannels are usually suitable for fluidic communications, such as carrying through a biological liquid. The microchannels are often part of an integrated device, such a microfluidic device or an integrated circuit such that liquid flowing through the microchannels are in a controlled pattern and able to be analyzed as desired.

A "microfluidic device" is a device that has one or more microchannels. A microfluidic device may be part of an integrated device, such as an integrated separation or detection equipment or an integrated circuit. Fluids used in microfluidic devices include whole blood samples, bacterial cell suspensions, protein or antibody solutions and various buffers and saline.

Microfluidic devices can be used to obtain many interesting measurements, including fluid mechanical properties, cellular and molecular diffusion coefficients, fluid viscosity, pH values, chemical and biological binding coefficients and enzyme reaction kinetics. Other applications for microfluidic devices include cell and molecule detection and separation, capillary electrophoresis, isoelectric focusing, immunoassays, flow cytometry, sample injection of proteins for analysis via mass spectrometry, DNA analysis, cell manipulation, and cell separation.

As used herein, "magnetic," "magnetic effect," and "magnetism" refer to the phenomena by which one material exert an attractive or repulsive force on another material. Although theoretically all materials are influenced to one degree or another by magnetic effect, those skilled in the art understand that magnetic effect or magnetism is only recognized for its detectability under the specific circumstance.

As used herein, a "permanent magnet" is a material, or any object substantially composed of said material, that has a magnetic field without relying upon outside influences (e.g electrical currents). Due to their unpaired electron spins, some metals are magnetic when found in their natural states, as ores. These include iron ore (magnetite or lodestone), cobalt, and nickel. A "paramagnetic material" refers to a material that attracts and repels like normal magnets when subject to a magnetic field. Paramagnetic materials include aluminum, barium, platinum, and magnesium. A "ferromagnetic material" is a material that can exhibit a spontaneous magnetization. Ferromagnetism is one of the strongest forms of magnetism and is the basis for all permanent magnets. Ferromagnetic materials include iron, nickel, and cobalt. A "superparamagnetic material" is a magnetic material that exhibits a behavior similar to that of a paramagnetic material at temperatures below the Curie or the Neel temperature.

"Solid support" and "support" refer to a material or group of materials having a rigid or semi-rigid surface or surfaces. In some aspects, at least one surface of the solid support will be substantially flat, although in some aspects it may be desirable to physically separate synthesis regions for different molecules with, for example, wells, raised regions, pins, etched trenches, or the like. In certain aspects, the solid support(s) will take the form of beads, resins, gels, microspheres, or other geometric configurations.

The term "chip", "microchip" or "printed circuit board" refers to a small device or substrate that comprises components for performing certain functions. A chip includes substrates made from silicon, glass, metal, polymer, or combinations and capable of functioning as e.g. a microarray, a macroarray and/or an integrated circuit. A chip may be a microelectronic device made of semiconductor material and having one or more integrated circuits or one or more devices.

A "chip" or "microchip" is typically a section of a wafer and made by slicing the wafer. A "chip" or "microchip" may comprise many miniature transistors and other electronic components on a single thin rectangle of silicon, sapphire, germanium, silicon nitride, silicon germanium, or of any other semiconductor material. In the embodiments of the invention, as discussed herein, microchannels, microfluidic devices, and magnetic tunnel junction sensors can also be integrated into a microchip.

As used herein, "maximum dimension" refers to those parameters or measurements required to define the shape and/or size, such as height, width, and length, of an object. As used herein, the maximum dimension of a two-dimensional object, such as a rectangle, a polygon, or a circle, is the longest straight-line distance between any two points on the object. Therefore, the maximum dimension of a circle is its diameter; a rectangle its diagonal, and a polygon its longest diagonal. The maximum dimension of a three-dimensional object is the longest straight-line distance between any two points on the object.

A "microprocessor" is a processor on an integrated circuit (IC) chip. The processor may be one or more processor on one or more IC chip. The chip is typically a silicon chip with thousands of electronic components that serves as a central processing unit (CPU) of a computer or a computing device.

In a first aspect according to the invention, a method is provided for manufacturing a device, said device comprising a miniaturized magnetic resonance system operatively connected with a cell culture micro-chamber, said method comprising a step of depositing a thin passivation film or layer on said miniaturized magnetic resonance system. In preferred embodiments according to the invention, said depositing is performed through a deposition process selected from chemical vapor deposition and physical vapor deposition.

The device of the invention is an integrated on-chip, miniaturized NMR or ESR device comprising a substrate having a cell culture micro-chamber for holding a sample operatively connected with a sensing and/or excitation element capable of generating an excitation magnetic field across at least a portion of the space. For the sake of conciseness, the device is also referred to hereinafter as "magnetic resonance bio-culture micro-chamber", abbreviated by the acronym μMRBM. Specific materials useful as the substrate include, but are not limited to, silicon, polystyrene, polydimethylsiloxane (PDMS), glass, chemically functionalized glass, polymer-coated glass, nitrocellulose coated glass, uncoated glass, quartz, plastics, metals and ceramics.

The method of the invention has been developed in order to obtain a μMRBM capable of bringing solid samples having a dimension typically comprised between 5 and 1000 μm, either alone or included into very small liquid medium volumes (i.e. less than about 1 μL), in close proximity to a sensing element (i.e. as close as 1 nm), thus providing an excellent spin-sensitivity for the samples under study and (a) sensing region(s) smaller than 1 μL.

By implementing a deposition layer as a manufacturing step for the device, the obtained device results passivated, conformally bound in all its components and possibly functionalized or otherwise able to be functionalized depending on the needs and circumstances. In preferred embodiments of the method of the invention, the thin passivation film or layer is deposited at least on said sensing element.

In preferred embodiments of the method of the invention, the μMRBM further comprises an active element configured to transmit an excitation signal to the at least one sensing element and/or to receive an input signal from said least one sensing element. In one embodiment, the passivating thin film or layer is deposited to the active element.

In one embodiment, the method of the invention further comprises a step of bonding a hosting micro-structure, defining a volume of a cell culture micro-chamber, to said miniaturized magnetic resonance system, thereby creating a cell culture micro-chamber. Preferably, the cell culture micro-chamber is located within the sensing and/or excitation region.

A particular embodiment of the method of the invention foresees at least the following steps:
a) providing a miniaturized magnetic resonance system;
b) providing a hosting micro-structure;
c) contacting said miniaturized magnetic resonance system with said hosting micro-structure, said hosting micro-structure defining a volume of a cell culture micro-chamber; and
d) bonding said miniaturized magnetic resonance system to said hosting micro-structure via a deposition process under conditions allowing to obtain a thin passivation film or layer, thereby creating a cell culture micro-chamber having a floor made of said thin passivation film or layer.

In an additional embodiment, the method further comprises a step of contacting said miniaturized magnetic resonance system with an enclosure element defining an enclosing volume.

As it will be evident for a person skilled in the art, another aspect of the present invention relates to a device obtainable by the method of the present invention. In particular, said device comprises a cell culture micro-chamber having a volume comprised between 0.1 nL and 14 bound to a miniaturized magnetic resonance system, said cell culture micro-chamber comprising a floor made of a deposited thin passivation film or layer.

In a preferred embodiment, the obtainable miniaturized magnetic resonance system comprises
a) at least one sensing element providing for a sensing and/or excitation region, and
b) an active element configured to transmit an excitation signal to the at least one sensing element and to receive an input signal from said least one sensing element,
wherein the cell culture micro-chamber is located within the sensing and/or excitation region.

The device of the invention is a versatile and easy to use sensor conceived for the study and analysis of very small samples via Nuclear Magnetic Resonance (NMR) and Electron Spin Resonance (ESR) techniques. Besides simply enabling such spectroscopic tools at volume scales below 1 μL, the invention relates to comprehensive micro-setups that allow for measurements on biological material in bio-compatible conditions. Such instrumentation allows the user to measure suitable biochemical parameters of a sample in a systematic way and in liquid environments of choice, at stabilized temperature conditions, and in an externally controlled perfusion state. The device may be used, for example, to inspect the chemical content of biological samples with the aim of performing an analysis or a diagnosis.

Preferably, the at least one sensing element and the active element are arranged in an ultra-compact configuration. An "ultra-compact" magnetic resonance device comprises the above-mentioned two elements disposed adjacent in a plane or stacked vertically. In its realization, an ultra-compact magnetic resonance sensor contains the two elements in a very small space, sufficiently close to each other so that the sensing capabilities are defined by the sensing element only, and not by the interconnections between the two elements. In such realization the sensor operates locally, therefore reducing the unwanted signals from materials that are placed around, below, and above the ultra-compact device.

In a further embodiment according to the invention, the device comprises a permanent magnet or an electromagnet capable of generating a static magnetic field across at least a portion of the space. A permanent magnet or electromagnet generates a static magnetic field across at least a portion of the space for holding a sample. Materials suitable for use as the permanent magnet or electromagnet include permanent magnetic materials, ferromagnetic materials, paramagnetic materials, and non-magnetic metals. When a ferromagnetic material is used for the magnet, an external magnetic field is used to magnetize the material. Further, when either a ferromagnetic or non-magnetic material is used for the magnet, an electrical current is applied to the material to create an electromagnet. In one embodiment of the invention, the magnet comprises one or more of iron, nickel, cobalt, a rare-earth material such as neodymium, copper, aluminium, and mixtures thereof. In some embodiments, the magnet is capable of generating a static magnetic field strength of from about 0.01 Tesla (T) to about 30 T, such as from about 0.01 T to about 10 T, from about 0.01 T to about 7 T or from about 0.01 T to about 5 T.

Preferably, the thin passivation film or layer is thinner than one third of the maximum linear dimension of the sensing element, and in some embodiments comprises a material selected for a list comprising resist/s, photoresist/s, Parylene-C, $SiO_2$, $Si_xN_y$, ceramics and polymer-derived ceramics. The ratio between the thin passivation film and the maximum linear dimension of the sensing element is an important parameter to be set, as the sensitivity decreases fast moving away from the sensing element surface, and it does so proportionally to power functions of the maximum linear dimension of the sensing element.

As a way of example, in order to have an optimal spin sensitivity within the sensing region of the device, and assuming the presence of a microcoil within the sensing or excitation element of about 180 µm as a maximum linear dimension, a passivation thin film would preferably have a thickness of less than 15 µm for analysis of embryos (about 100 µm in size). With a sensing or excitation element having a maximum linear dimension of 500 µm (for stem-cells derived tissues having a size of about 300 to 600 µm), a passivation film thickness up to about 40 µm could be suitable. For samples of about 1 mm in size such as organoids or so-called cancer droplets, a passivation film thickness up to about 100 µm would suit well.

Some embodiments of the invention envisage magnetic resonance bio-culture micro-chambers based on opto-magnetic sensors as sensing elements. Opto-magnetic phenomena are now known to be capable of direct detection of the dynamics of the sample magnetization typical of magnetic resonance experiments. One example of such sensing scheme is the one of nitrogen-vacancy defects in diamond structures, where the optical read-out from the sensing element is based on excitation and detection with light combined, in some realisations, with micro-wave excitation of the Zeeman levels of the electrons that are present in the defects. Diamond structures of this kind can also be thought as being the basis of ultra-compact magnetic resonance tools and are commonly referred as "color centers".

Figure 1:
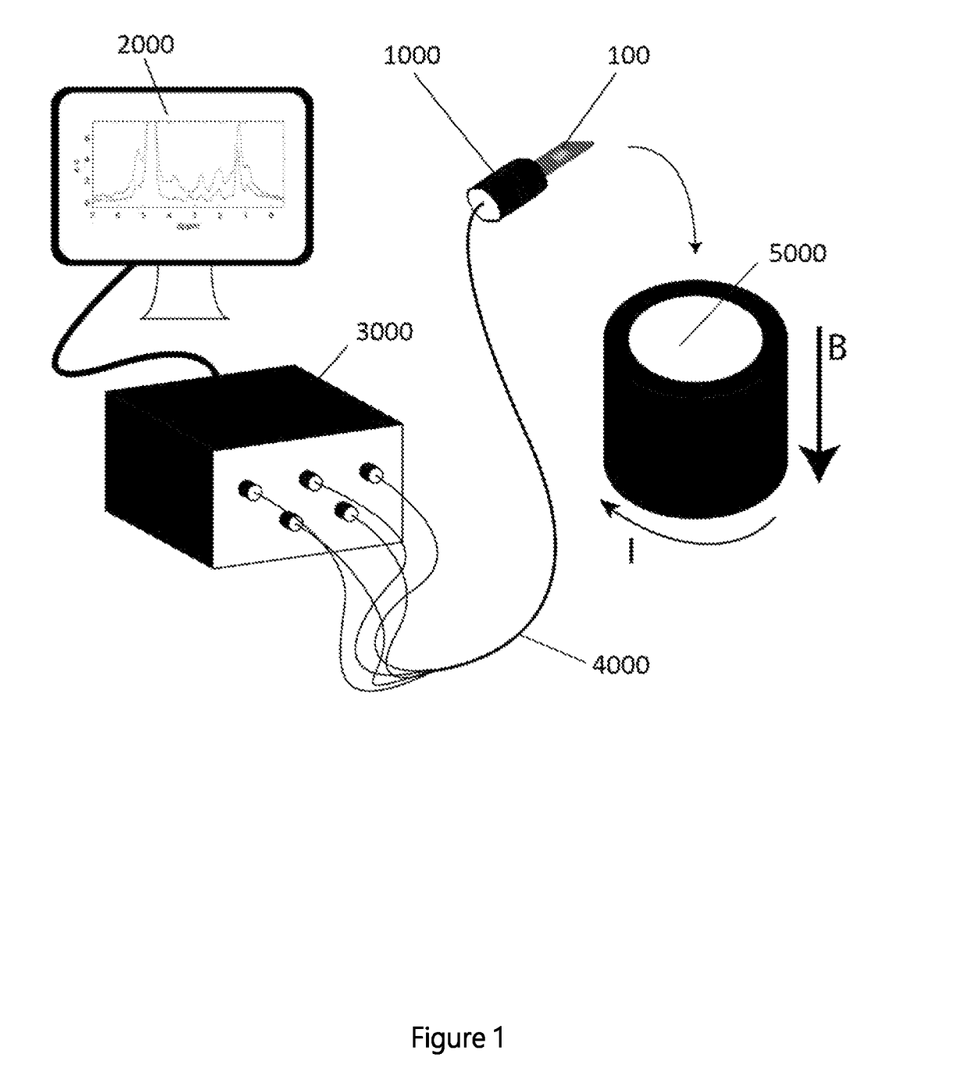
FIG. 1 shows a schematic of one embodiment of a complete magnetic resonance setup where NMR microsystems (referred as μMRBM) are plugged into a receptacle and inserted in a magnet for use.

With reference to FIG. 1, one schematic embodiment of a complete magnetic resonance setup comprising a NMR micro-system (a "magnetic resonance bio-culture micro-chamber" or "µMRBM") 100 according to the invention is shown. In the depicted embodiment, the device 100 is plugged into a receptacle 1000 and inserted into a permanent magnet or an electromagnet 5000 for use. The properties of the magnet 5000 can vary depending on the methodology used to create the static magnetic field B. Permanent magnets 5000 can produce magnetic fields B having strengths up to 1 T, and above this value up to a few T when a Halbach configuration is used. For high magnetic fields, i.e. 5 T and above, superconducting coils with injected high current density are typically used. The connection between the receptacle 1000 and the printed circuit board on which the µMRBM 100 is hosted is implemented via male-female electrical connectors. A multi-signal cable 4000 interfaces the receptacle to a console 3000, which contains well-known electronics, and allows the user to control experimental parameters and collect data via a computer system 2000.

Figure 2A:
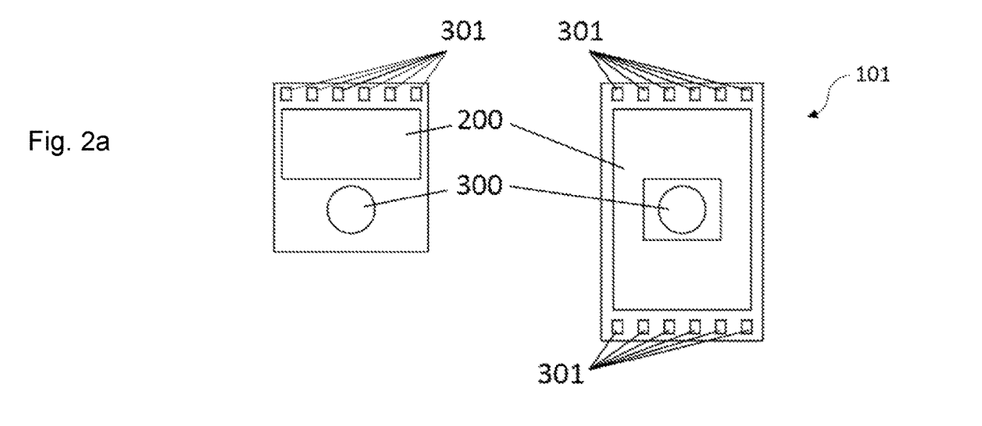
FIG. 2a shows top-view schematics of two embodiments of ultra-compact sensor geometries, which comprise pads, active element, sensing and/or excitation element.
Figure 2B:
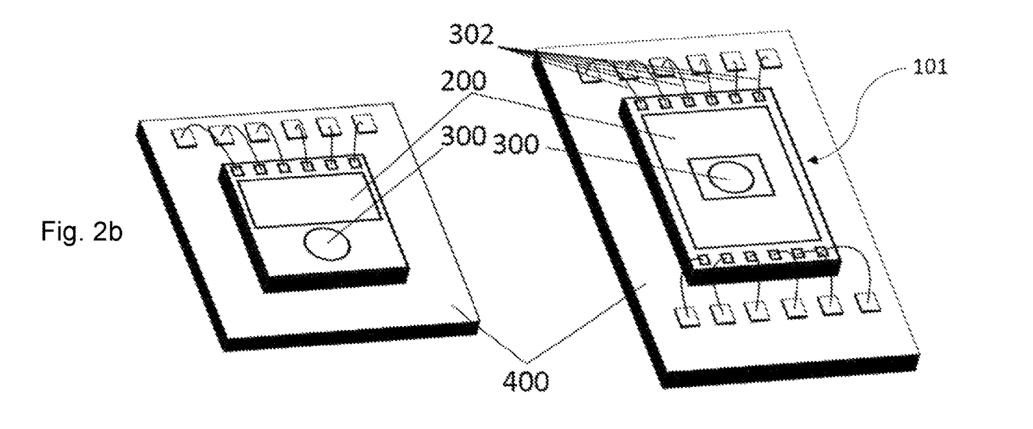
FIG. 2b shows 3D renderings of such ultra-compact sensors mounted on a printed circuit board.

With reference to FIG. 2a, a top-view schematics of two embodiments of ultra-compact sensor 101 geometries are shown. In the embodiment shown on the left, the sensor 101 comprises a sensing and/or excitation element 300 in close proximity and adjacent in a plane with an active element 200 and a plurality of pads 301, whereas embodiment on the right the sensing and/or excitation element 300 is surrounded by the active element 200. FIG. 2b shows 3D renderings of the same two embodiments, further showing bonding wires 302 connecting the pads 301 with a printed circuit board 400.

Figure 3A:
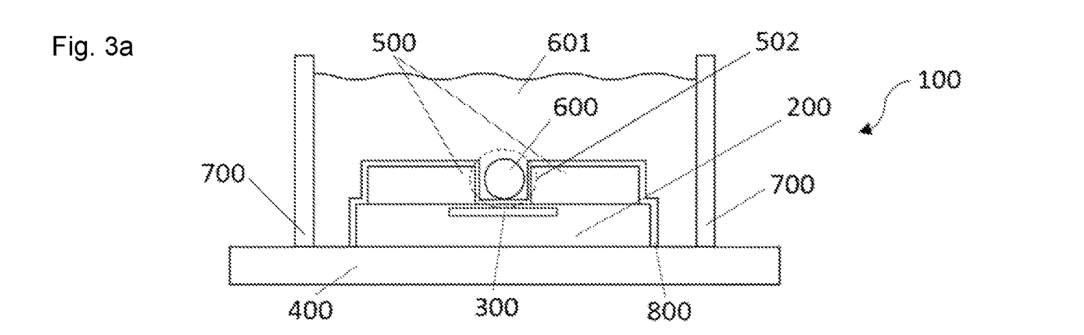
Figure 3B:
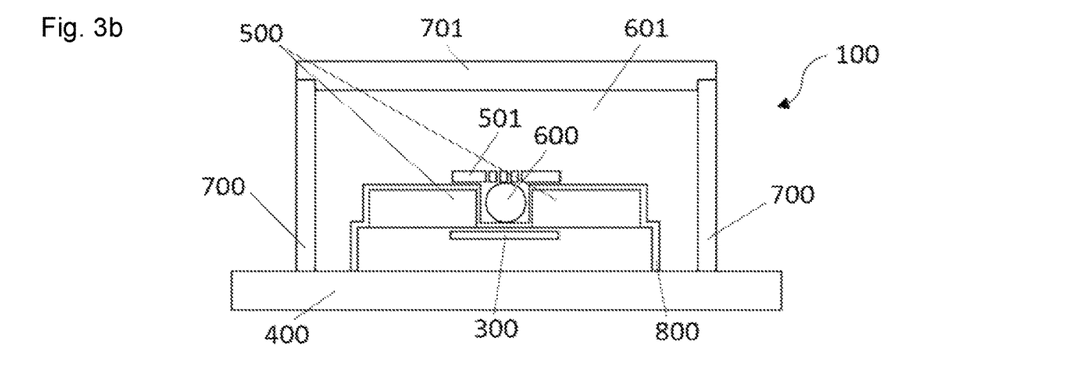
Figure 3C:
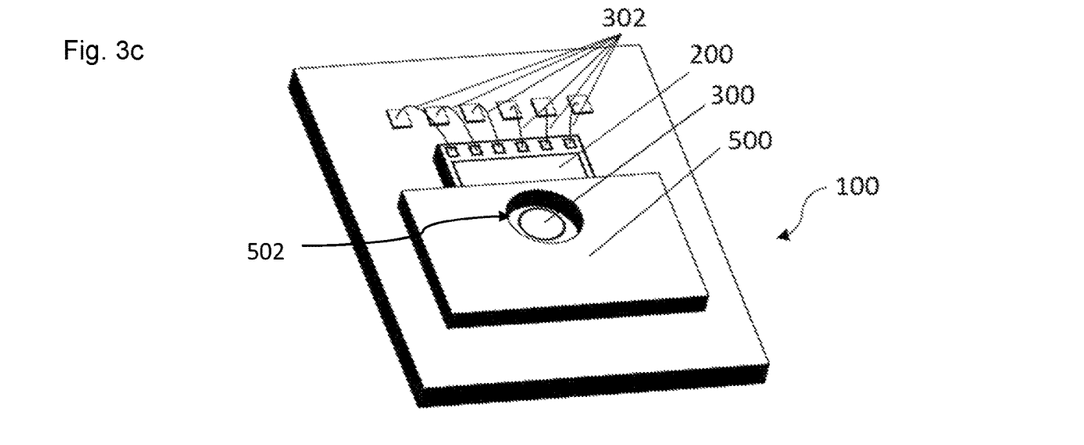
FIG. 3c shows a 3D rendering of the ultra-compact sensor, combined with the hosting micro-structure, mounted on a printed circuit board.

One embodiment of a schematic view of a µMRBM 100 is illustrated in FIG. 3a-3c. A basic µMRBM 100 comprises four main components: an ultra-compact magnetic resonance sensor 101, a hosting-micro-structure 500, an enclosure 700 and a passivation-binding layer 800. In the embodiment shown on FIGS. 3a and c, a solid sample 600, such as for instance a biological sample as an embryo, is placed within the hosting micro-structure 500 in a culture micro-chamber 502 in correspondence to the sensing and/or excitation element 300, so to sense a magnetic field in the sensing and/or excitation region. The sample 600 is kept in suitable culture conditions by including a culture medium 601 within the enclosing structure 700. In the embodiment shown on FIG. 3b, an enclosing top cover 701 seals the enclosing structure 700, thus assuring sterility and avoiding medium leakage.

Embodiments of the invention include additional features that address further needs such as: the need to perform measurements at controlled temperature, the need to place the µMRBM vertically, the need to perfuse the µMRBM, the need to capture biological samples at the sensing region, the need to control other properties of a culture medium, the need to make spin manipulations using auxiliary coils external to the ultra-compact sensor, etc.

In some embodiments, a hosting micro-structure 500 can be operatively connected with microfluidic channels so to enable fluidic connections for e.g. flushing of liquids or medium 601, to and from the hosting-microstructure 500. In some embodiments, the liquid flushed also serves as a vehicle to drive the sample 600 to and from a capture site. In these embodiments of the invention, the sample/s 600 is/are kept at the culture micro-chamber 502 while confined along the direction perpendicular to the ultra-compact device surface, particularly within the sensing region defined by the sensing element 300. Such feature is useful for, e.g., use of the µMRBM 100 in a vertical magnetic field, where the effect of gravity and the manipulations required to place the µMRBM 100 in the magnetic field can be such that the sample 600 escapes the culture micro-chamber 502 and, therefore, the sensing region. These embodiments of the invention can also be used to address the needs of an array-implementation, where multiple samples are analysed in large numbers simultaneously and/or in pipeline. The placement of large numbers of samples and their retrieval can be addressed, in the embodiments thereof, in an automatic way and/or in a single flushing operation.

Embodiments of the invention include hosting micro-structures 500 comprising top-covers (501; FIG. 3b). By "top-cover for hosting micro-structure" is herein meant an element, on top of the hosting micro-structure 500, that can be used to confine a sample 600 hosted in the direction perpendicular to the ultra-compact device 100 surface. Such feature is essential for, e.g., use of the μMRBM 100 in a vertical magnetic field, where the effect of gravity and the manipulations required to place the μMRBM in the magnetic field can be such that the sample escapes the culture micro-chamber 502 and, therefore, the sensing region. In these embodiments the user is capable to manually and/or in an automated way manipulate the top-cover 501 of the hosting micro-structure 500 to access the culture micro-chamber 502 for manual and/or automated sample 600 placement and retrieval.

Embodiments of the invention include top-covers 501 that can have different functions with respect to the liquid medium 601 contained within the enclosure 700 and surrounding the sample 600 in the hosting micro-structure 500. Top-covers 501 can allow liquid to flow freely between culture micro-chamber 502 and enclosure. Such top-covers can be realized, for instance, by having a perforated structure as top-cover. Top-covers can also include a semi-permeable portion, as exemplarily shown in FIG. 3b, which can selectively prevent outward flow of molecular species from the culture micro-chamber 502 to the liquid reservoir contained within the enclosure 700 and/or produced by the sample 600 (e.g., produced by chemical reactions or metabolism of a biological sample). Analogously, the semi-permeable portion can also prevent inward flow, in the culture micro-chamber 502, of molecular species consumed by the sample (e.g., consumed by chemical reactions or metabolism of a biological sample). Top-covers can prevent any liquid exchange between culture micro-chamber 502 and enclosure 700.

Embodiments of the invention include top-covers 501 which are based on "bi-stable mechanisms". A "bi-stable mechanism" is one in which the potential energy of the system has two local minima separated by a maximum. The minima are the two possible equilibrium positions of the system which can be referred to as open/closed or on/off. The maximum acts as a barrier between the two positions. Switching between the two equilibrium positions requires application of a sufficient, controlled external force. This force can be provided by several methods including: gravity via reorientation of the μMRBM 100, mechanical force applied locally to the top-cover 501, a piezo-electric system, an electro-phoretic system, an opto-mechanical system acting on the top-cover 501, a magnetic system, pneumatic systems or suitable combinations thereof. Embodiments of the invention also include "multi-stable mechanisms", where more than one local minimum of the potential energy is present. An example of such multi-stable mechanism is the ratchet system.

Embodiments of the invention include top-covers 501 which are based on "pivot mechanisms". A "pivot mechanism" is one in which the top-cover can rotate freely around a pivot point placed on the hosting micro-structure 500. An example is one in which the rotation direction is parallel to the top surface of the hosting micro-structure 500. In such a configuration, the angular range of rotation of the top-cover can be unlimited or limited, e.g. by protrusions appositely placed on the ultra-compact device 100 surface. Another example of pivot mechanism is one in which the top-cover 501 rotates around a joint which is parallel to the top surface of the hosting micro-structure 500. In such a configuration, the top-cover 501 would act as a hatch door for the culture micro-chamber 502.

Embodiments of the invention include top-covers 501 which are based on "sliding door mechanisms". Such mechanisms are those in which the top-cover 501 slides in guides incorporated in the hosting micro-structure 500. The sliding direction and range are defined by the guides. An example is one in which the guides are grooves in the hosting micro-structures which match complementary protrusions on the top-cover 501.

According to one embodiment of the invention, the hosting micro-structure 500 and top-cover 501 can be fabricated using direct laser writing via two photon photopolymerization. In the case of a "bistable mechanism", hosting micro-structure 500 and top-cover 501 are fabricated as a single unit which remains as such during use. In other embodiment (e.g. a "pivot mechanism" or a "sliding door mechanism"), the hosting microstructure 500 and top-cover 501 can be fabricated as a monolithic structure where the two are held together by connections which are removed prior to use, thereby obtaining two separate objects. Alternatively, the two objects can be fabricated separately and then combined prior to use.

Embodiments of the invention include hosting micro-structures 500 with sealed culture micro-chambers 502, in which a substance (e.g., water or rubber) is enclosed during the fabrication. Such enclosed substances can be fabricated via any sealing mechanism, for example by bonding techniques, where first the micro-structure is fabricated with open-roof, and later closed by bonding a cap-layer. Bonding between microstructure is also possible using materials that have high compatibility with magnetic resonance experiments of liquids and biological samples (polymer, glass, semiconductors, ceramics). These are all well-established methods for each particular material case, to properly seal the channel to avoid liquid leakage.

According to one embodiment of the invention, the hosting micro-structure 500 can be fabricated by means of microfabrication techniques based on sequences involving material coating, photolithography, development and etching. A covered hosting micro-structure can be made, in particular, by surface micromachining using a sacrificial layer approach, where a buried structured layer is removed by a sacrificial removal step by means of etchants or solvents. For example, high-aspect ratio polymer photolithography (such as SU-8, Ormocers etc.) are transparent thick resists compatible with the micro-structure requirements.

The geometrical properties and the nature of the materials used to realise the hosting microstructure are taken into account in the design as they can significantly affect the performance of the instrument. It is known indeed, by those skilled in the art, that both the geometrical properties combined with the magnetic susceptibility properties are parameters of extreme importance as they relate directly to the magnetic field distortions in the sensing region and, therefore, to broadening of the spectral lines. The magnetic susceptibility of a material, indicated as $\chi_v$, is defined by the relation $M=\chi_v H_0$ where M is the magnetization of the material when this is merged into an external magnetic field strength $H_0$. In this definition $\chi_v$ is a dimensionless quantity and relates to the capability of the material to build magnetization when subjected to a magnetic field.

As the μMRBM according to the invention is conceived, among other applications, for the analysis of samples immersed in culture media, it is deemed that in the sensing region liquid media that have a susceptibility similar to the one of water ($H_2O$) will be present. Such liquids will be in direct contact with the edges of the hosting micro-structure and, therefore, will generate surfaces where there are magnetic susceptibility mismatches. Called $\chi_1$ and $\chi_2$ the magnetic susceptibilities of the mismatched surfaces, distortions of the magnetic field that are directly proportional to $(\chi_1-\chi_2)B_0 \sin(\theta)$ will result, where $\theta$ is the angle between the external static field and the mismatched surface.

Accordingly, hosting micro-structures 500 that implement embodiments of the invention are made of materials that have high compatibility with magnetic resonance experiments of liquids and biological samples. Such materials are characterized by a magnetic susceptibility that does not differ from the one of water by more than 10 ppm of $\chi_{H2O}$. Such materials include among others: silicones, photoresists, most polymers (e.g., acrylic), epoxies, gels (e.g. alginate and agarose-based gels), glasses, polyurethanes, Teflon, ceramics.

In μMRBMs 100 according to the invention, one essential element is a passivation-binding layer 800 as indicated in FIGS. 3a-3c. Such layer 800 has multiple roles: as a binding element, as a passivation layer and as a functionalized layer. The binding is between the hosting micro-structure 500 and the ultra-compact sensor. Such binding role is essential to give the necessary robustness that make the μMRBM 100 user friendly and readily accepted in everyday practice. The role of passivation is essential to prevent electrical connection between the sensor and the medium. Without passivation, a μMRBM will face problems in its electrical functioning.

According to one specific embodiment of the invention, the passivation-binding layer can be fabricated via physical vapour deposition (PVD) techniques, either thermal or e-beam evaporation in a vacuum chamber, or by sputtering in a plasma chamber. Both methods are well established for the deposition of thin dielectric films such as Parylene, $SiO_2$, SiN, etc. In some variations the coated thin film is conformal and not only covered the top surface but also sidewalls and parts on the specimen that are in the shadow of the material source. Spray-coating of ceramics or polymer-derived ceramics are possible methods to obtain a passivation-binding layer.

In embodiments of the invention the passivation-binding layer 800 is exploited, via surface treatments, as a substrate to be adapted to both cell growth and exposure to specific media. A functionalized layer 800 allows the user to customize the surface properties depending on the needs and circumstances, such as the sought applications and the sample to be analysed, so to extend the range of applications. As a way of example, Poly-cloro-p-xylylene, often referred as Parylene-C, is a suitable material for a passivation-binding layer 800 in a μMRBM 100, as it is known to be capable of high quality encapsulation, electrolyte barrier features, chemical inertness, bio-compatibility. It is also known, by those skilled in the art, that surface of materials such as Parylene-C, $SiO_2$, or other candidate passivation-binding layers, can be treated in order to change the hydrophilic properties and improve interaction with cells that grow in contact with this substrate. Embodiments of the invention include μMRBM 100 having a surface-treated passivation-binding layer 800 to improve bio-compatibility and hydrophilic properties thereof. Parylene-C passivation-binding layers 800, which are used in the preferred embodiment of the invention, are known to assume properties that compare well to standard tissue culture substrates once their surface is opportunely treated.

In some embodiments of the invention, a μMRBM 100 undergoes oxygen plasma treatments, UV irradiation, silanization processes, additional coating procedures, drop-on-demand inject printing, local PVD via shadow masks, polymer grafting. All these treatments can be considered to be used separately or in combination via multi-step protocols. In some embodiments of the invention only one surface treatment is applied on the whole exposed surface. In some embodiments of the invention only one surface treatment is performed on target regions of the exposed passivation-binding layer 800. In some embodiments of the invention there is a combination of surface treatment procedures that individually target either the whole exposed surface, single or multiple sub-area/s of the exposed passivation-binding layer 800. In some embodiments of the invention the same surface treatment is applied in multiple steps that target different areas of the passivation-binding layer 800 or the whole exposed surface.

In some embodiments, the device of the invention comprises an ambient temperature sensor within the enclosure 700 to measure the temperature of the surrounding liquid/culture medium. Further, in some other embodiments according to the invention, the μMRBM 100 can comprise heating element/s and/or cooling element/s aimed at controlling the temperature of the surrounding liquid/culture medium.

In both NMR and ESR, the manipulations of the sample magnetization and/or of the magnetic field in which the sample is immersed, provide powerful ways to extract information during the experiment. One example is the so called CPMG (Carr-Purcell-Meiboom-Gill) sequence, where the sample magnetization is flipped in space with the aim of measuring the relaxation properties of the NMR signal. Another example is the WATERGATE sequence (Water suppression by Gradient Tailored Excitation), where pulsed field gradients are added to the static field and, combined with selective excitation pulses, allow for the suppression of the water signal. Another example is given by magnetic resonance imaging, where pulsed field gradients are at the base of the image reconstruction procedures.

In some embodiments, the μMRBM 100 of the invention comprises one or more inductors, also referred to herein as "auxiliary coils" 303/305, configured to introduce manipulations (further than what done with the excitation/detection element) of sample magnetization and/or manipulations of the external static field (e.g., by field gradients and/or spin flips; FIGS. 4 and 5). Such inductors 303/305 can possibly be used also to sense or improve the sensing power of the μMRBM 100. Such auxiliary coils 303/305 are either: connected to the board 400 hosting the μMRBM 100; connected to wires that are detached from the μMRBM printed circuit board/s 400; shorted for operation via inductive coupling; connected to structures that are part of the insert directly sustaining or not the μMRBM 100; connected to structures that are sustained and/or only guided by the magnet bore/opening; connected to micro-chip pads; connected to micro-chip electronics; connected to micro-electronics co-integrated with the ultra-compact sensor. Auxiliary coils can be further classified as "external" or "internal" coils.

Figure 4A:
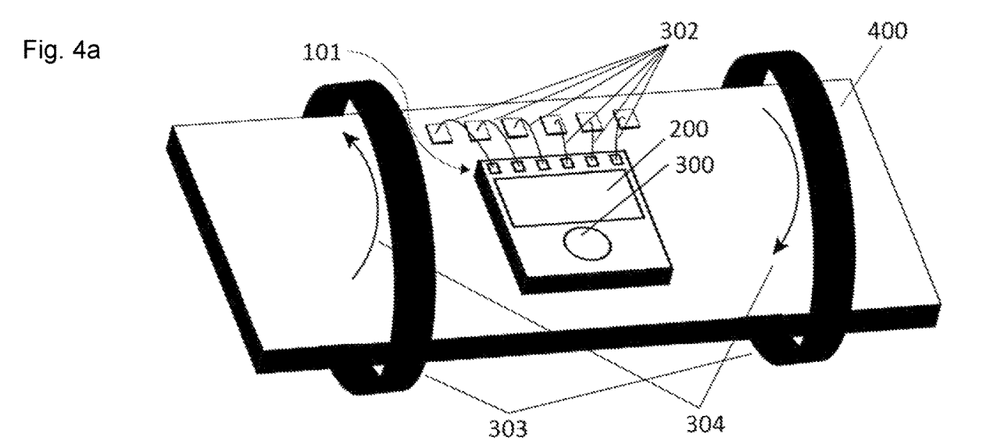
Figure 4B:
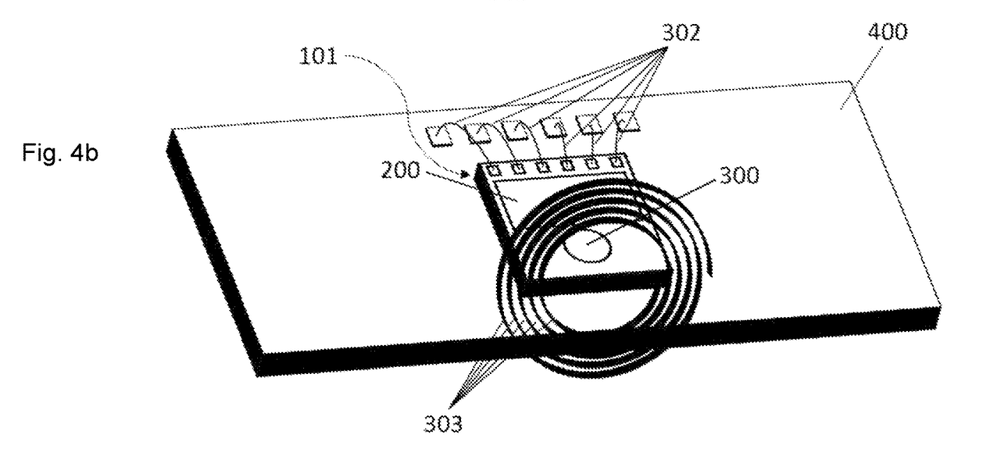

Embodiments of the invention, as shown in FIGS. 4a-4b, include "external auxiliary coils" 303 aimed at manipulations of sample magnetization and/or manipulations of the external static field via circulation of currents 304. External auxiliary coils 303 are inductors having any geometry, capable to produce magnetic perturbation in the sensing region of the μMRBM 100, whose metallic windings are such that the current passing through the coil does not run through metal belonging to the same micro-chip substrate containing the ultra-compact sensor 101. External auxiliary coils 303 can be contained in micro-chips or micro-structures other than the one integrating the ultra-compact sensor 101. External auxiliary coils can be implemented in the hosting micro-structure 500 that defines the μMRBM 100. FIGS. 4a-4b shows two basic examples of external auxiliary coils 303 complementing an ultra-compact sensor 101. One way to add a gradient and/or excitation coil is to physically place it surrounding the μMRBM 100: this strategy can be used to re-cycle standard pulsed gradient coils used in standard NMR probes (FIG. 4a).

FIG. 4b also shows the possibility of using unilateral coils placed in close proximity of the μMRBM 100. Such coils can be used to both implement pulsed gradients or excitation pulses. Their use for excitation pulses generation can be advantageous, for instance, in cases where magnetic field homogeneity is critical or in heteronuclear excitation experiments. External auxiliary coils 303 can have any geometry and size. External auxiliary coils 303 can be placed around the μMRBM enclosure 700 (therefore not in contact with the liquid medium 601), within the enclosure 700 (therefore in contact with the liquid medium 601), or a combination of both.

Figure 5A:
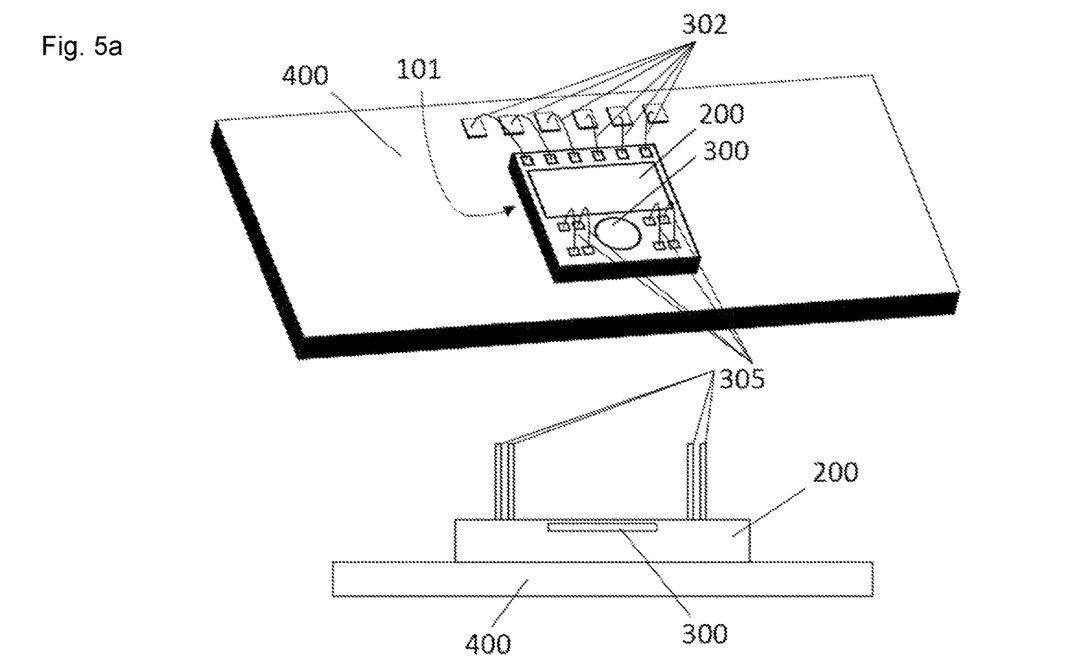
In FIG. 5a wire bonding and on-chip metals are used to make a portion of a coil.
Figure 5B:
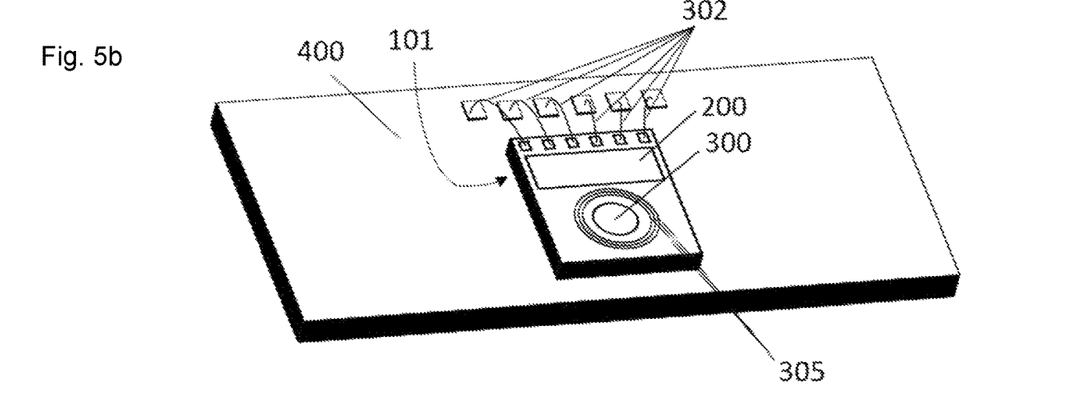
FIG. 5b shows the case of an auxiliary coil strongly coupled to the sensing element and entirely realized with the metal layers available on the micro-chip hosting the ultra-compact sensor.

Embodiments of the invention include "internal auxiliary coils" 305 aimed at manipulations of sample magnetization and/or manipulations of the external static field. Internal auxiliary coils are inductors having any geometry, capable to produce magnetic perturbation in the sensing region of the μMRBM 100, whose metallic windings are such that the current passing through such inductor, at least for a portion of its total path, runs through metal belonging to the same micro-chip substrate containing the ultra-compact sensor 101 (bonding pads can be considered of this kind). FIGS. 5a-5b illustrates two basic examples of internal auxiliary coils 305. In FIG. 5a wire bonding and on-chip metals form inductors that can be used for field manipulation within the sensing region. Internal auxiliary coils can be made by any geometry and come in any size. In FIG. 5b it is shown the case of an auxiliary coil 305 strongly coupled to the sensing element 300 and entirely realized with the metal layers available on the micro-chip hosting the ultra-compact sensor 101. With the same approach it is possible to realize gradient coils that act locally in the sensing region. Internal auxiliary coils 305 are placed, at least partially, within the enclosure 700 (therefore in contact with the liquid medium 601). Internal auxiliary coils 305 can also be used, more efficiently with respect to external ones, to improve or complement sensing: embodiments of the invention include μMRBMs 100 that have multiple sensing coils targeting the same volume space.

Figure 6A:
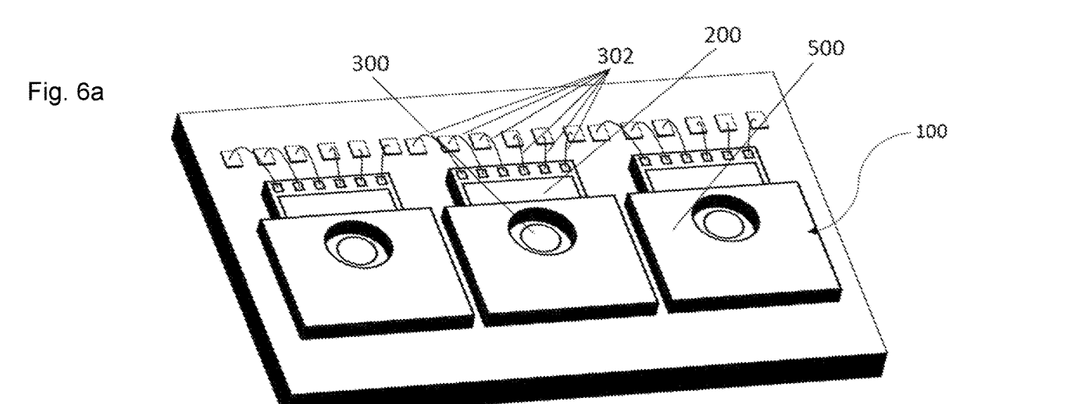
FIG. 6a shows an array where individual ultra-compact sensors are placed on the same printed circuit board, each interfaced to a hosting micro-structure.
Figure 6B:
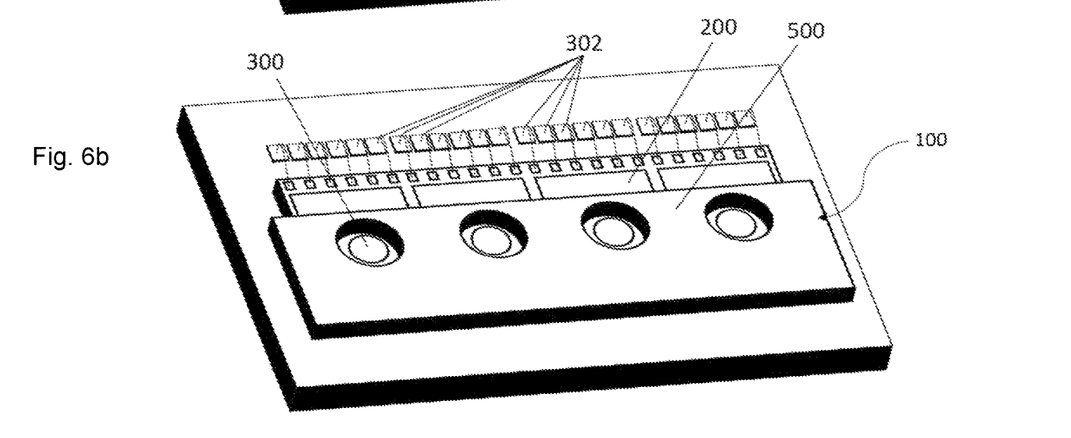
FIG. 6b shows an array where a single micro-chip substrate contains multiple ultra-compact sensors, and a single hosting micro-structure targets each excitation and/or detection region individually.

Embodiments of the invention foresee arrayed μMRBMs, where multiple μMRBMs 100 can operate in the same static magnetic field (FIGS. 6a-6b). An arrayed μMRBM can be realized as a collection of separated μMRBMs 100 placed on the same printed circuit board 400 or placed on separated circuit boards that interconnect in a modular way. An arrayed μMRBM contains multiple excitation/detection elements 300 that can be interfaced with: a single comprehensive electronic system implemented on a single micro-chip substrate 101, a single comprehensive electronic system implemented on multiple micro-chip substrates 101, independent electronic systems implemented on a single micro-chip substrate 101, independent electronic systems implemented on separated micro-chip substrates 101. By definition of μMRBM, ultra-compact arrayed sensors 101 are implemented together with hosting micro-structures 500, passivation-binding layer 800, and external enclosure 700. The hosting micro-structure/s 500 can be made by a single micro-structure that interfaces with all the excitation and/or detection elements 300, by multiple and separated micro-structures 500 that are interfaced with a single excitation and/or detection element 300, or by multiple and separated micro-structures 500 that are interfaced with more than one excitation and/or detection element 300. The enclosure 700 in arrayed μMRBM can be one containing the entire array or separated in multiple independent enclosures 700 containing either one μMRBM or arrayed μMRBM. All the above-mentioned configurations, and combinations of these, define an arrayed μMRBM.

FIG. 6a shows an arrayed μMRBM where individual μMRBMs 100 are placed on the same printed circuit board 400. FIG. 6b shows an arrayed μMRBM containing multiple ultra-compact sensors 101, and a single hosting micro-structure 500 targets each excitation and/or detection region individually. The multiple μMRBMs 100 may be used in parallel, using the same experimental parameters, to increase throughput and thus statistics. Alternatively, the individual μMRBMs 100 in an array can be used to simultaneously perform different experiments such as: 1-D spectroscopy, 2-D spectroscopy (correlation spectroscopy, J-spectroscopy, exchange spectroscopy, etc.), measurement of relaxation times $T_1$ and $T_2$. Furthermore, a subset of μMRMs can be left without samples and be used for background measurement. Also for embodiments of an arrayed μMRM, auxiliary coils 303/305, aimed at manipulations of sample magnetization and/or manipulations of the external static field, can be envisaged.

REFERENCES

1. Massin, C., et al., High-Q factor RF planar microcoils for micro-scale NMR spectroscopy. Sensors and Actuators a-Physical, 2002. 97-8: p. 280.
2. Olson, D. L., et al., High-Resolution Microcoil H-1-Nmr for Mass-Limited, Nanoliter-Volume Samples. Science, 1995. 270(5244): p. 1967.
3. Spengler, N., et al., Micro-fabricated Helmholtz coil featuring disposable microfluidic sample inserts for applications in nuclear magnetic resonance. Journal of Micromechanics and Microengineering, 2014. 24(3).
4. Grisi, M., G. Gualco, and G. Boero, A broadband single-chip transceiver for multi-nuclear NMR probes. Review of Scientific Instruments, 2015. 86(4).
5. Ha, D., et al., Scalable NMR spectroscopy with semiconductor chips. Proceedings of the National Academy of Sciences, 2014.
6. Kim, J., B. Hammer, and R. Harjani, A 5-300 MHz CMOS Transceiver for Multi-Nuclear NMR Spectroscopy. 2012 Ieee Custom Integrated Circuits Conference (Cicc), 2012.
7. Sun, N., et al., CMOS RF Biosensor Utilizing Nuclear Magnetic Resonance. Ieee Journal of Solid-State Circuits, 2009. 44(5): p. 1629.

The invention claimed is:
1. A device comprising:
a miniaturized magnetic resonance system, comprising:
(a) a sensing element having at least one of a sensing or excitation region, and

(b) an active element configured to transmit an excitation signal to the sensing element and/or to receive an input signal from said sensing element and comprising electronics;

an enclosure defining an enclosing volume configured for holding a liquid; and a hosting microstructure defining a cell culture chamber having a volume comprised between 0.1 nL and 1 mL, wherein said cell culture chamber is comprised within said enclosure so as to be in contact with said liquid when said liquid is provided in said enclosure; and a passivation-binding layer that covers at least one part of said system and said cell culture chamber, acting as an isolating shield material preventing physical, chemical and/or electrical connections between electrical components and liquid media, wherein said sensing element and said active element are co-integrated, either adjacent in a plane or stacked vertically, on a same printed circuit board and said cell culture chamber is located on top of said sensing element.

2. The device according to claim 1, wherein said cell culture chamber comprises a floor made of said passivation-binding layer.

3. The device according to claim 1, wherein said passivation-binding layer covers at least said sensing element.

4. The device according to claim 1, wherein the sensing and/or excitation region is defined by said sensing element and wherein said cell culture chamber is located within said region.

5. The device according to claim 1, further comprising a permanent magnet or an electromagnet capable of generating a static magnetic field.

6. The device according to claim 1, wherein said passivation-binding layer is thinner than one third of the diameter, or of maximum linear dimension, of the sensing element.

7. The device according to claim 1, wherein said passivation-binding layer comprises a material selected from a list comprising resist/s, photoresist/s, Parylene-C, $SiO_2$, $Si_xN_y$, ceramics and polymer-derived ceramics.

8. The device according to claim 1, manufactured in part by depositing a thin passivation-binding layer on at least one part of said system.

9. The device according to claim 8, wherein said depositing is performed through a deposition process selected from chemical vapor deposition and physical vapor deposition.

10. The device according to claim 8, manufactured in part by a step of bonding a hosting micro-structure to said miniaturized magnetic resonance system, in such a way as to create said cell culture chamber within said micro-structure.

11. The device according to claim 8, manufactured in part by the steps of:
   a) providing a miniaturized magnetic resonance system comprising said sensing element and said active element;
   b) providing a hosting micro-structure;
   c) contacting said system with said micro-structure; and
   d) bonding said system to said micro-structure via a deposition process under conditions allowing to obtain a passivation-binding layer, thereby creating a cell culture chamber for the analysis of biological samples of less than about 1000 μm in size, said chamber having a floor made of said passivation-binding layer.

12. The device according to claim 8, manufactured in part by a step of contacting said system with an enclosure defining an enclosing volume.

13. The device according to claim 1, wherein said sensing region is smaller than 1 mL.

14. The device according to claim 1, wherein said passivation-binding layer has a thickness between 0.1 and 0.5 mm.

15. The device according to claim 1, wherein said sensing element is a micro-coil having an inner diameter between 0.1 and 0.5 mm.

16. The device according to claim 1, further comprising a top cover located on top of the hosting microstructure and configured to confine a biological sample within the cell culture chamber.

* * * * *